(12) United States Patent
Lee

(10) Patent No.: US 7,505,338 B2
(45) Date of Patent: Mar. 17, 2009

(54) MEMORY SYSTEMS AND MEMORY CARDS THAT USE A BAD BLOCK DUE TO A PROGRAMMING FAILURE THEREIN IN SINGLE LEVEL CELL MODE AND METHODS OF OPERATING THE SAME

(75) Inventor: Bong-Ryeol Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 82 days.

(21) Appl. No.: 11/769,156

(22) Filed: Jun. 27, 2007

(65) Prior Publication Data

US 2008/0181015 A1    Jul. 31, 2008

(30) Foreign Application Priority Data

Jan. 31, 2007    (KR)    ...................... 10-2007-0010155

(51) Int. Cl.
*G11C 7/00* (2006.01)
(52) U.S. Cl. .................................. 365/200; 365/185.09
(58) Field of Classification Search ................. 365/200, 365/185.09
See application file for complete search history.

(56) References Cited

U.S. PATENT DOCUMENTS

| 6,574,746 | B1 | 6/2003 | Wong et al. |
| 6,947,326 | B2 | 9/2005 | Torii |
| 2005/0286299 | A1* | 12/2005 | Tomita et al. .......... 365/185.11 |

FOREIGN PATENT DOCUMENTS

| KR | 10-2000-0064279 A | 11/2000 |
| KR | 10-2002-0087168 | 11/2002 |
| KR | 10-2005-0105311 A | 11/2005 |
| KR | 10-2006-0006554 A | 1/2006 |
| KR | 10-2006-0107689 | 10/2006 |
| KR | 10-2006-0107716 | 10/2006 |
| KR | 10-2007-0014470 A | 2/2007 |

* cited by examiner

*Primary Examiner*—Huan Hoang
*Assistant Examiner*—Jason Lappas
(74) *Attorney, Agent, or Firm*—Myers Bigel Sibley & Sajovec, P.A.

(57) ABSTRACT

A memory system includes a host, a flash memory that is configured to store multi-bit data in one memory cell, and a memory controller that is configured to control programming of multi-bit data provided by the host into the flash memory. When an $n^{th}$ bit is normally programmed, and a fail occurs in programming an n+1th bit in the flash memory, a memory block of the flash memory including a fail cell is operated in an operation mode of the nth or lesser bit. Related memory systems and methods are also provided.

21 Claims, 6 Drawing Sheets

MEMORY SYSTEMS AND MEMORY CARDS THAT USE A BAD BLOCK DUE TO A PROGRAMMING FAILURE THEREIN IN SINGLE LEVEL CELL MODE AND METHODS OF OPERATING THE SAME

CROSS-REFERENCE TO RELATED APPLICATION

This U.S. non-provisional patent application claims priority under 35 U.S.C. § 119 to Korean Patent Application No. 2007-10155, filed on Jan. 31, 2007, the entire contents of which are hereby incorporated by reference.

BACKGROUND OF THE INVENTION

The present invention disclosed herein relates generally to memory systems, and more particularly, to memory systems and memory cards in which a bad block is used in a single level cell (SLC) mode.

Recently, the number of devices using nonvolatile memories has increased. For example, an MP3 player, a digital camera, a mobile phone, a camcorder, a flash card, and a solid state disk (SSD) are examples of devices that use nonvolatile memories as storage devices.

As more devices use nonvolatile memories as storage devices, the capacity of the nonvolatile memory is drastically increasing. One method for increasing memory capacity is a so-called multi level cell (MLC) method in which a plurality of bits is stored in one memory cell.

FIG. 1 is a block diagram illustrating a conventional memory system. Referring to FIG. 1, a conventional memory system 100 includes a host 110, a memory controller 120, and a flash memory 130.

The memory controller 120 includes a buffer memory 121. The flash memory 130 includes a cell array 131 and a page buffer 132. Although not shown in FIG. 1, the flash memory 130 includes a decoder, a data buffer, and a control unit.

The memory controller 120 receives data and a write command from the host 110, and controls the flash memory 130 to program data into the cell array 131. Also, the memory controller 120 controls the flash memory 130 to read data stored in the cell array 131 according to a read command input from the host 110.

The buffer memory 121 temporarily stores therein data to be programmed into the flash memory 130, and data read from the flash memory 130. The buffer memory 121 transfers the temporarily stored data to the host 110 or the flash memory 130 under control of the memory controller 120.

The cell array 131 of the flash memory 130 includes a plurality of cells. The memory cells are nonvolatile and can retain stored data even when no power is applied. A page buffer 132 is a buffer that stores data to be programmed into a selected page of the cell array, or data read from a selected page.

A memory cell of the flash memory 130 is categorized into a single level cell (SLC) and a multi level cell (MLC) according to the number of data bits that can be stored therein. The SLC can store single-bit data, and the MLC can store multi-bit data.

The SLC, a memory cell storing single-bit data, will now be described. The SLC has two states depending on distribution of a threshold voltage. After being programmed, the memory cell stores data 1 or data 0. A memory cell storing data 1 is considered to be in an erase state, and storing data 0 is considered to be in a program state. The cell in the erase state may be called an "on-cell," and the cell in the program state may be called an "off-cell."

The flash memory 130 performs a program operation by page. The memory controller 120 transfers data to the flash memory 130 by page, using the internal buffer memory 121 during a program operation.

The page buffer 132 temporarily stores data loaded from the buffer memory 121, and simultaneously programs the loaded data to a selected page. After the program operation is completed, a program verification operation for verifying whether data is correctly programmed or not is performed.

If the program verification result is a "program fail," a program operation and a program verification operation are performed again with an increased program voltage. After the program operation for one-page of data is completed in the above described manner, the next data are received for a program operation.

An MLC, a memory cell storing multi-bit data, will now be described. FIGS. 2 and 3 illustrate a process of programming a least significant bit (LSB) and a most significant bit (MSB), that is, 2-bit data, into one memory cell.

Referring to FIG. 2, a memory cell is programmed to have any one of four states 11, 01, 10 and 00 according to distribution of a threshold voltage. First, a process of programming the LSB is the same as that of programming of the SLC. A memory cell having a state 11 is programmed to have a state A indicated by a dotted line according to the LSB.

To program the MSB, the memory controller transfers one-page data in the buffer memory 121 to the flash memory 130. Referring to FIG. 2, the memory cell in state A indicated by a dotted line is programmed to be in state 00 (program 1) or be in state 10 (program 2) according to the MSB. A memory cell in state 11 maintains state 11 or is programmed to be in state 01 (program 3) according to the MSB.

Referring to FIG. 3, a memory cell is programmed to have any one of four states 11, 10, 00 and 01 according to distribution of a threshold voltage. First, a memory cell in state 11 maintains the state 11 or is programmed to be in state 10 (program 1) according to the LSB. Thereafter, the MSB is programmed. A memory cell in state 10 maintains the state 10 or is programmed to be in state 00 (program 2) according to the MSB. A memory cell in state 11 maintains the state 11 or is programmed to be in state 01 (program 3) according to the MSB.

Referring again to FIG. 1, the memory system 100 uses the above-described method to program multi-bit data into the cell array 131 of the flash memory 130. That is, the LSB is programmed first in a memory cell, and then the MSB is programmed in the same memory cell.

While the MSB is programmed after the programming of the LSB, a program fail may occur. In general, a possibility of a program fail is relatively low in the case of an SLC, while being relatively high in the case of an MLC because of a small threshold voltage margin of the cell. As the number of bits programmed in one MLC increases, the possibility of the program fail gradually increases.

In conventional MLC technology, a program fail occurs when the MSB is programmed after the LSB is normally programmed. In this case, a memory block including a fail cell is processed as a bad block. The fail cell cannot be restored even by an error correction circuit (ECC). Thus, in conventional MLC technology, because the memory block including a fail cell is processed as a bad block, even normal cells in the bad block become unavailable for an LSB programming operation.

SUMMARY

Embodiments of the present invention provide a memory system and a memory card capable of using a memory block including a cell where a least significant bit (LSB) is normally programmed but a most significant bit (MSB) fails to be programmed, without classifying the memory block as a bad block.

In some embodiments of the present invention, a memory system includes a host, a flash memory that is configured to store multi-bit data in one memory cell, and a memory controller that is configured to control programming of multi-bit data provided by the host into the flash memory. When an $n^{th}$ bit is normally programmed, and a fail occurs in programming an n+1th bit in the flash memory, a memory block of the flash memory including a fail cell is operated in an operation mode of the nth or lesser bit.

In other embodiments, the operation mode of the memory block including the fail cell is stored in a cell array of the flash memory.

In still other embodiments, the cell array of the flash memory is divided into a data field and a spare field, and the operation mode of the memory block including the fail cell is stored in the spare field.

In still other embodiments, the cell array of the flash memory includes a plurality of memory blocks, and the operation mode of the memory block including the fail cell is stored in one of the plurality of memory blocks.

In still other embodiments, the one of the plurality of memory blocks is a meta-block.

In still other embodiments, the memory controller includes a mode storage that stores the operation mode of the memory block including the fail cell.

In still other embodiments, the mode storage is an EEPROM (electronically erasable programmable read-only memory).

In still other embodiments, the flash memory and the memory controller are integrated within one memory card.

In still other embodiments, the flash memory is a NAND flash memory.

In further embodiments of the present invention, a memory card includes a flash memory configured to store multi-bit data in one memory cell and a memory controller configured to control programming of multi-bit data into the flash memory. When an $n^{th}$ bit is normally programmed, and a fail occurs in a programming an $n+1^{th}$ bit in the flash memory, a page of the flash memory including a fail cell is operated in an operation mode of the $n^{th}$ or lesser bit.

In still further embodiments, the operation mode of the page including the fail cell is stored in a cell array of the flash memory. In still further embodiments, the cell array of the flash memory is divided into a data field and a spare field, and the operation mode of the page including the fail cell is stored in the spare field.

In still further embodiments, the cell array of the flash memory includes a plurality of memory blocks, and the operation mode of the page including the fail cell is stored in one of the plurality of memory blocks.

In still further embodiments, the one of the plurality of memory blocks is a meta-block.

In still further embodiments, the memory controller includes a mode storage that stores the operation mode of the page including the fail cell.

In still further embodiments, the mode storage is an EEPROM (electronically erasable programmable read-only memory).

Although described primarily above with respect to apparatus embodiments of the present invention, it will be understood that the present invention may also be embodied as methods for operating a memory system or device.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF EMBODIMENTS

Figure 1:
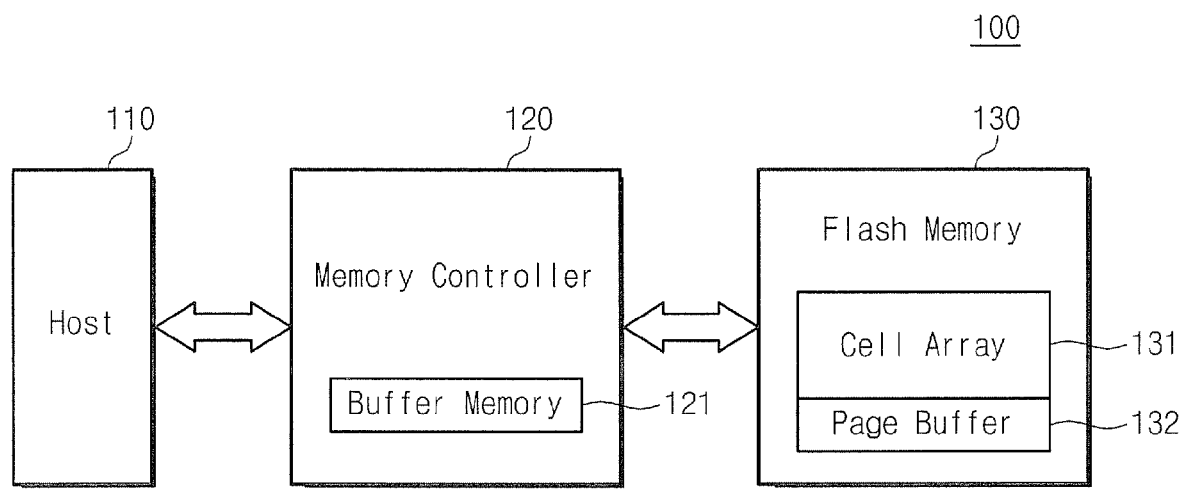
FIG. 1 is a block diagram illustrating a conventional memory system.

While the present invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims.

It will be understood that when an element is referred to as being "connected to" or "coupled to" another element, it can be directly connected or coupled to the other element or intervening elements may be present. In contrast, when an element is referred to as being "directly connected to" or "directly coupled to" another element, there are no intervening elements. As used herein, the term "and/or" and "/" includes any and all combinations of one or more of the associated listed items. Like numbers refer to like elements throughout the description.

The terminology used herein is for the purpose of describing particular embodiments only and is not intended to be limiting of the invention. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that although the terms first and second are used herein to describe various components, circuits, regions, layers and/or sections, these components, circuits, regions, layers and/or sections should not be limited by these terms. These terms are only used to distinguish one component, circuit, region, layer or section from another component, circuit, region, layer or section. Thus, a first component, circuit, region, layer or section discussed below could be termed a second component, circuit, region, layer or section, and similarly, a second component, circuit, region, layer or section may be termed a first component, circuit, region, layer or section without departing from the teachings of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

In some embodiments of the present invention, when a least significant bit (LSB) is normally programmed into a memory cell, and a most significant bit (MSB) fails to be programmed into the memory cell, a memory block including the memory cell (i.e., fail cell) is operated in a single level cell (SLC) mode. In some embodiments of the present invention, the memory block including the fail cell is not processed as a bad block, but is reused in the SLC mode. Hence, a flash memory can be efficiently used.

Figure 4:
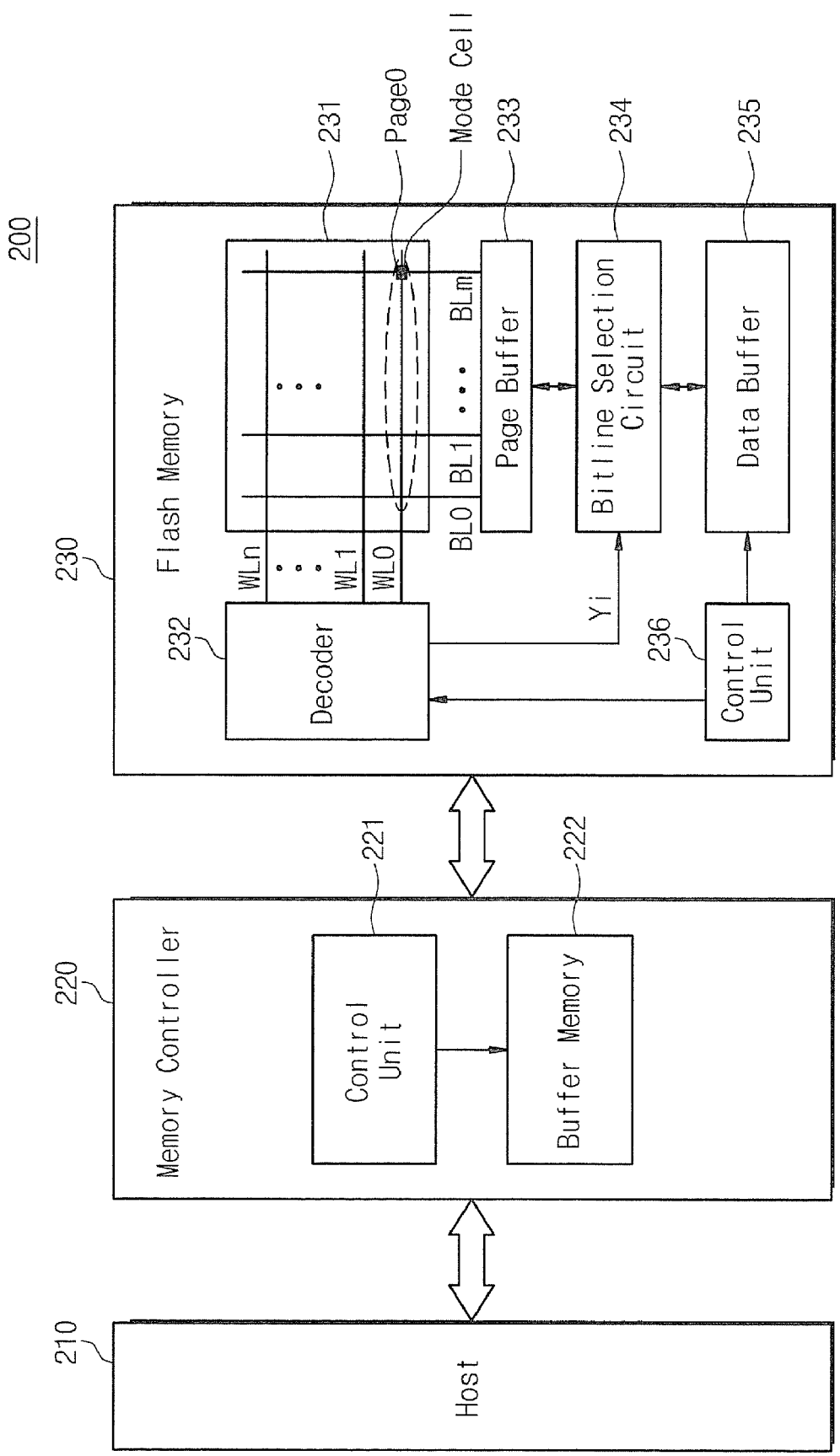
FIG. 4 is a block diagram illustrating a memory system according to some embodiments of the present invention.

FIG. 4 is a block diagram illustrating a memory system according to some embodiments of the present invention. Referring to FIG. 4, a memory system 200, according to some embodiments of the present invention, includes a host 210, a memory controller 220, and a flash memory 230. Here, the flash memory 230 may store multi-bit data in one memory cell.

In FIG. 4, the memory controller 220 and the flash memory 230 may be included in one memory card. Examples of the memory card include a multimedia card (MMC), a secure digital (SD) card, an xD card, a CompactFlash (CF) card, a subscriber identity module (SIM) card. The memory card is connected to the host 210 for use, and examples of the host 210 include a computer, a notebook computer, a digital camera, a cellular phone, an MP3 player, and a PMP.

The memory controller 220 controls overall operation (e.g., program or read operation) of the flash memory 230. Referring to FIG. 4, the memory controller 220 includes a control unit 221 and a buffer memory 222.

The control unit 221 receives a command and a control signal from the host 210. The control unit 221 controls the buffer memory 222 and the flash memory 230 according to the input command to operate the flash memory 230, corresponding to the command.

The buffer memory 222 is used to temporarily store data to be programmed in the flash memory 230 or data read from the flash memory 230. The data stored in the buffer memory 222 is transferred to the flash memory 230 or the host 210 under control of the control unit 221. The buffer memory 222 may be implemented as a random access memory (RAM), for example, an SRAM or a DRAM.

Still referring to FIG. 4, the flash memory 230 includes a cell array 231, a decoder 232, a page buffer 233, a bit line selection circuit 234, a data buffer 235, and a control unit 236. FIG. 4 illustrates a NAND flash memory as an example.

The cell array 231 includes a plurality of memory blocks (not shown). Each of the memory blocks includes a plurality of pages (e.g., 32 pages, 64 pages), and each page includes a plurality of memory cells (e.g., 512B, 2 KB) sharing one word line (WL). In the case of the NAND flash memory, an erase operation is performed in units of a memory block, and read and program operations are performed in units of a page.

Figure 2:
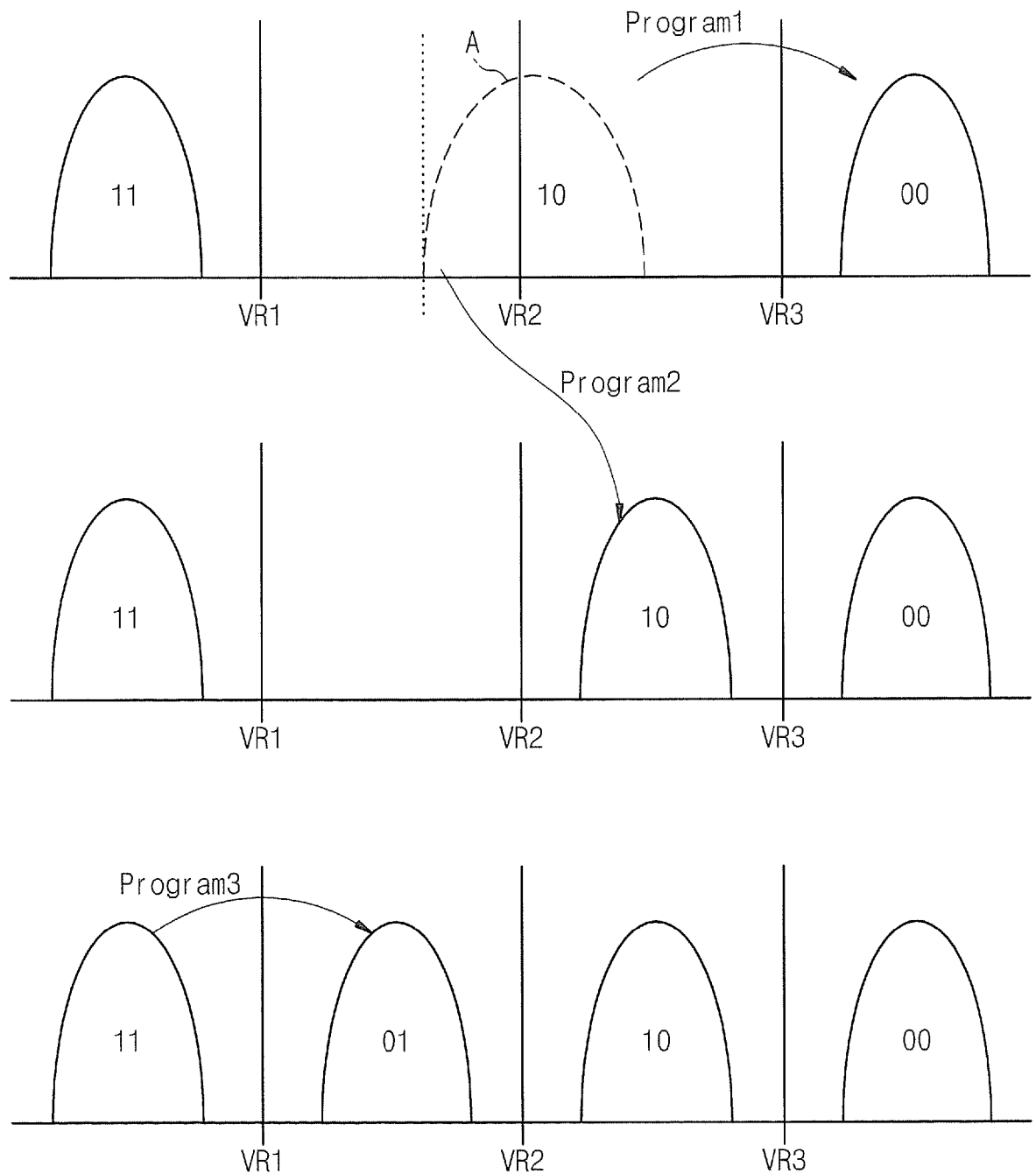
FIGS. 2 and 3 are diagrams illustrating a process of programming multi bit data into one memory cell.
Figure 3:
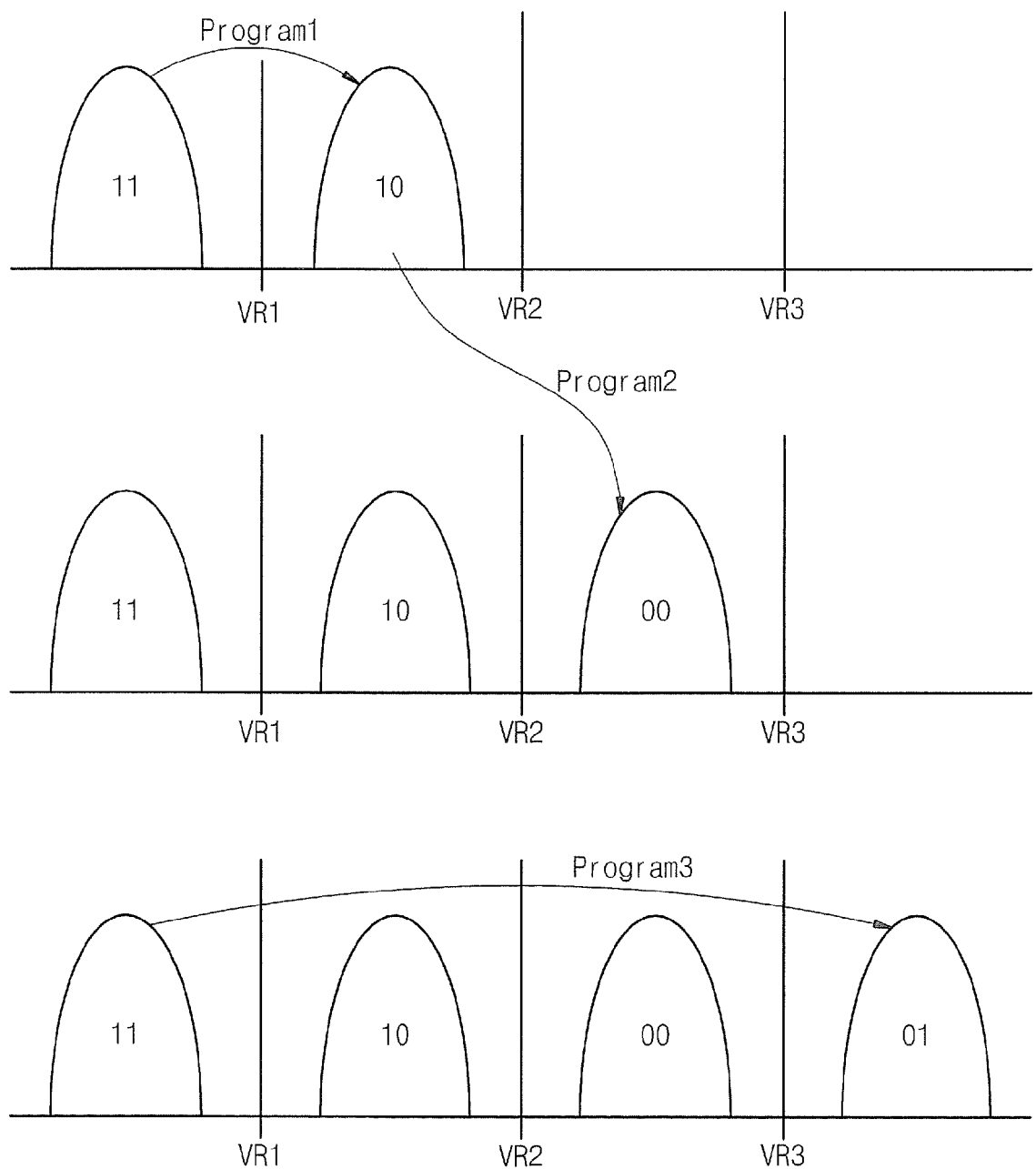

Referring to FIGS. 2 and 3, when two-bit data is stored in one memory cell, each memory cell has four states or levels according to distribution of a threshold voltage. Hereinafter, the case where two-bit data is stored in one multi-level cell will be described. However, the present invention may also be applied to the case where more than 2-bit data (e.g., 3-bit data or 4-bit data) is stored in one multi level cell (MLC).

Even a multi level cell (MLC) that stores 2-bit data in one memory cell may store only 1-bit of data therein. That is, the flash memory 230 may operate a specific page or a specific memory block in an SLC mode or an MLC mode. Information on whether the specific page or the memory block is operated in the SLC mode or the MLC mode may be stored in the memory controller 220 or the flash memory 230.

Referring to FIG. 4, the memory system, according to some embodiments of the present invention, stores information on the SLC mode or the MLC mode in a mode cell of the flash memory 230. The flash memory 230 is operated in the SLC mode or the MLC mode according to the mode cell. In FIG. 4, a selected page (page0) includes one mode cell (indicated by a black point). The mode cell includes information about an operation mode of the selected page (page0), that is in the SLC mode or the MLC mode.

In general, the cell array 231 is divided into a data field and a spare field. On the assumption that one page size is 528B, 512B corresponds to the data field, and 16B corresponds to the spare field. The mode cell is included in the spare field. If the LSB is normally programmed and the MSB fails to be programmed in the flash memory 230, single level cell (SLC) mode information is stored in a mode cell within the spare field. Once the SLC mode information is recorded in the mode cell, then a page including a fail cell is operated in the SLC mode. Also, some embodiments of the present invention may allow a memory block including a fail cell to be operated in the SLC mode.

The decoder 232 is connected to the cell array 231 through word lines WL0 to WLn, and is controlled by the control unit 236. The decoder 232 receives an address (ADDR) from the memory controller 220, and selects one word line (e.g., WL0) or generates a selection signal Yi to select a bit line BL. The page buffer 233 is connected to the cell array 231 through bit lines BL0 to BLm.

The page buffer 233 stores data loaded from the buffer memory 222. One-page data is loaded in the page buffer 233, and the loaded data are simultaneously programmed into a selected page (e.g., page0) at the time of a program operation. In contrast, the page buffer 233 reads data from the selected page (e.g., page0) at the time of a read operation, and temporarily stores the read data. The data stored in the page buffer 233 is transferred to the buffer memory 222 in response to a read enable signal (nRE, not shown).

The bit line selection circuit 234 is a circuit for selecting a bit line in response to the selection signal Yi. The data buffer 235 is an input/output buffer used for data transfer between the memory controller 220 and the flash memory 230. The control unit 236 is a circuit for receiving a control signal from the memory controller 220, and controlling internal operation of the flash memory 230.

The memory system 200, according to some embodiments of the present invention, includes a mode cell in the flash memory 230. According to some embodiments, in the case where the LSB is normally programmed and the MSB fails to be programmed, SLC mode information is recorded in the mode cell. In the case where the SLC mode information is recorded in the mode cell, a page or a memory block including a fail cell is operated in the SLC mode.

The memory system 200 illustrated in FIG. 4 may operate in the same manner as the conventional art when a fail does not occur during program operations of the LSB and the MSB. However, if the LSB is normally programmed but the MSB fails to be programmed, a page or a memory block including a fail cell is operated in the SLC mode. A conventional memory system processes a memory block including a fail cell as a bad block, while a memory system, according to some embodiments of the present invention, processes the memory block including the fail cell in the SLC mode, so that the flash memory 230 can be efficiently used as compared to a conventional memory system.

Although one memory cell is represented as a mode cell in FIG. 4, mode information may be recorded in a plurality of mode cells according to multi-bit (e.g., 3 bit, or 4 bit). The memory controller 220 reads mode information recorded in the flash memory 230 at the time of power up. The memory controller 220 performs control so that a selected page or a memory block of the flash memory is operated in the SLC mode or the MLC mode according to the mode information.

Figure 5:
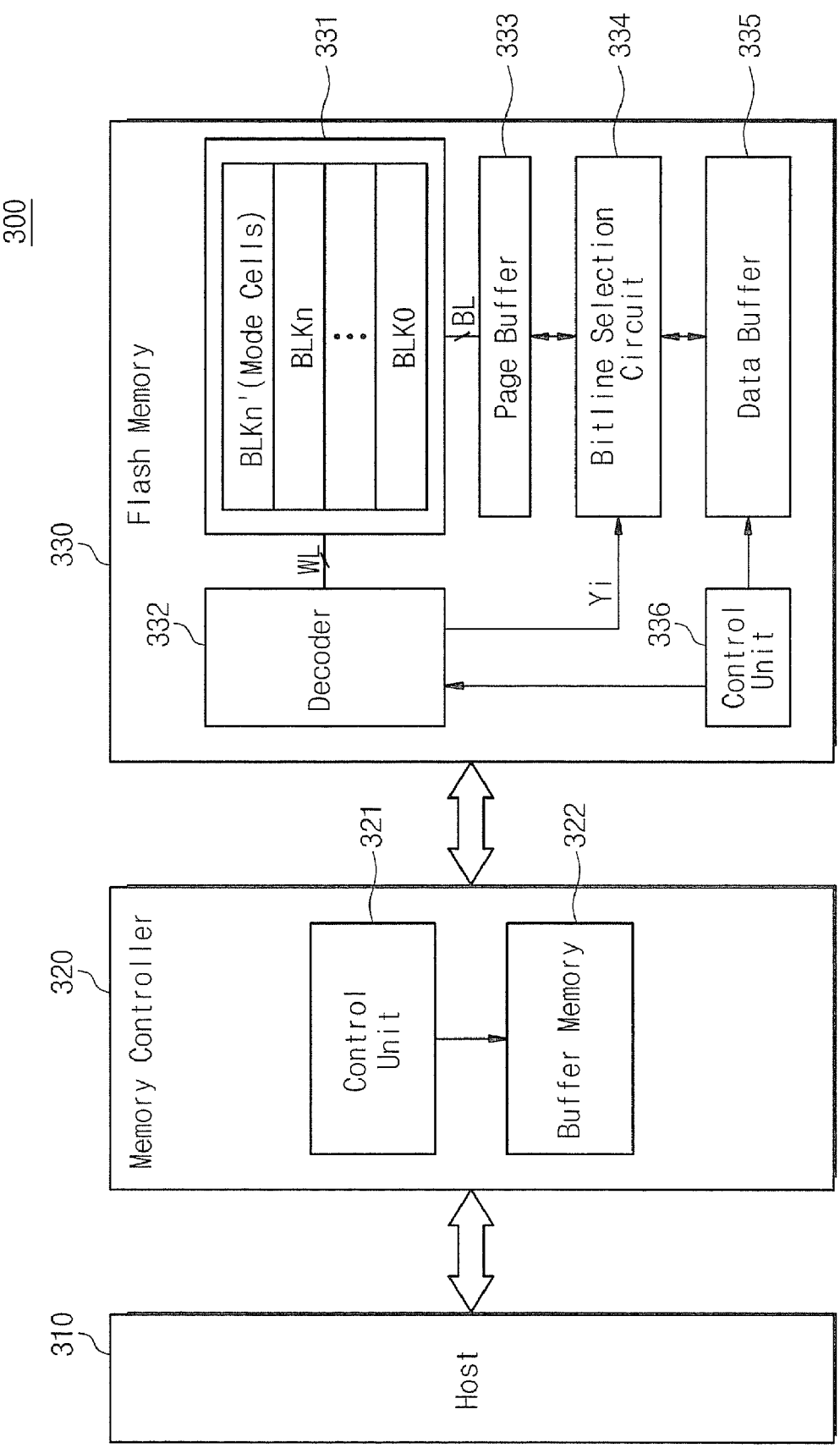
FIG. 5 is a block diagram illustrating a memory system according to further embodiments of the present invention.

FIG. 5 is a block diagram illustrating a memory system according to further embodiments of the present invention. Referring to FIG. 5, a memory system 300, according to some embodiments of the present invention, includes a host 310, a memory controller 320, and a flash memory 330. The memory controller 320 includes a control unit 321 and a buffer memory 322. Operations of those components are the same as described above with reference to FIG. 4.

Referring to FIG. 5, a cell array 331 includes a plurality of memory blocks BLK0 to BLKn, BLKn'. Each of the memory blocks includes a plurality of pages (not shown). Each of the pages includes a plurality of memory cells (not shown). The memory cell may store single-bit data or multi-bit data (e.g., 2 bit).

One BLKn' of the plurality of memory blocks includes a mode cell. In the case where an LSB is normally programmed and an MSB fails to be programmed, information about a page or a memory block including a fail cell is stored in a mode cell within the memory block BLKn'. That is, the memory system 300, according to some embodiments of the present invention, stores information about a page or a memory block including a fail cell in a specific memory block BLKn', not in the spare field of each page.

Here, the specific memory block BLKn' may be a meta-block that stores address mapping information. The memory controller 320 reads mode information recorded in the meta-block of the flash memory 330 during an address mapping operation. The memory controller 220 performs control so that a selected page or the memory block of the flash memory 330 is operated in the SLC mode or the MLC mode according to the mode information.

Figure 6:
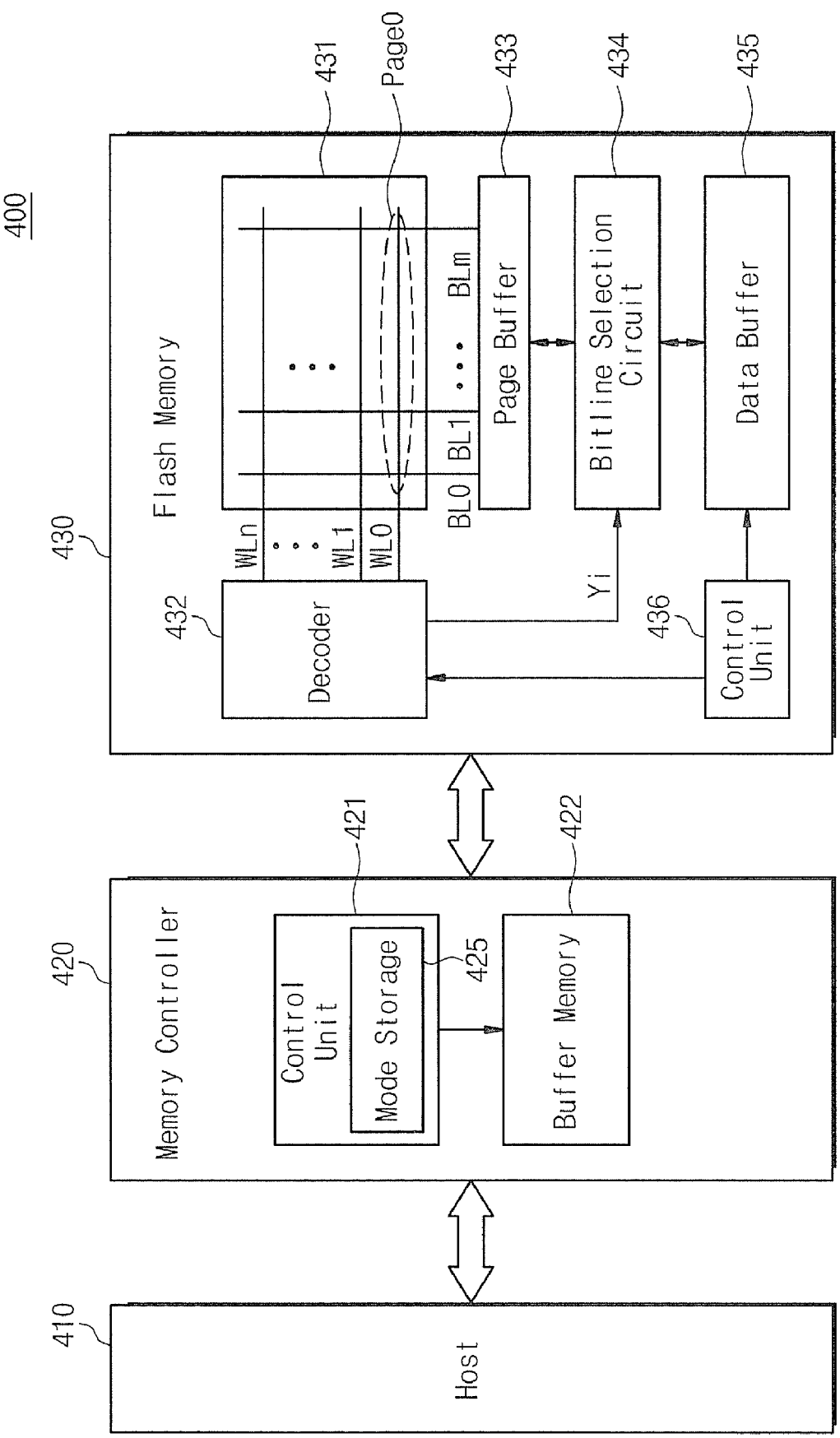
FIG. 6 is a block diagram illustrating a memory system according to still further embodiments of the present invention.

FIG. 6 is a block diagram illustrating a memory system according to further embodiments of the present invention. Referring to FIG. 6, a memory system 400, according to some embodiments of the present invention, includes a host 410, a memory controller 420, and a flash memory 430. The memory controller 420 includes a control unit 421 and a buffer memory 422.

Referring to FIG. 6, the control unit 421 includes a mode storage 425. The mode storage 425 stores a program mode (i.e., operation mode) (e.g., SLC mode or MLC mode) of the flash memory 430. When an LSB is normally programmed, and an MSB fails to be programmed, mode information of a page or a memory block including a fail cell is stored in the mode storage 425 in the memory controller 420. That is, the memory system 400, according to some embodiments of the present invention, stores information of a page or a memory block including a fail cell in the memory controller 420, not in the flash memory 430. The mode storage 425 may be implemented as a resistor or an EEPROM.

As described above, when the LSB is normally programmed and the MSB fails to be programmed, the memory system, according to some embodiments of the present invention, operates a memory block including a fail cell in an SLC mode, without processing the memory block as a bad block.

As the number of bits to be stored in one memory cell increases, a possibility of a program fail of the MSB gradually increases in the flash memory. According to some embodiments of the present invention, the fail cell may be used corresponding to the number of bits of the fail cell. For example, it is assumed that 4-bit data is stored in one memory cell. In this case, if a fail occurs in a 3-bit program operation, a page or a memory block including a fail cell may be operated in a 2-bit mode according to the present invention. If a fail occurs in a 4-bit program operation, a page or a memory block including a fail cell may be operated in a 3-bit mode.

In a memory system and a memory card according to some embodiments of the present invention, if an LSB is normally programmed and an MSB fails to be programmed, a memory block including a fail cell is operated in a signal level cell (SLC) mode, without processing the memory block as a bad block. Because the bad block is used in the SLC mode, efficiency of a flash memory can be increased.

In concluding the detailed description, it should be noted that many variations and modifications can be made to the preferred embodiments without substantially departing from the principles of the present invention. All such variations and modifications are intended to be included herein within the scope of the present invention, as set forth in the following claims.

That which is claimed:

1. A memory system, comprising:
   a host;
   a flash memory configured to store multi-bit data in one memory cell; and
   a memory controller configured to control programming of multi-bit data provided by the host into the flash memory;
   wherein when an $n^{th}$ bit is normally programmed, and a fail occurs in programming an n+1th bit in the flash memory, a memory block of the flash memory including a fail cell is operated in an operation mode of the nth or lesser bit.

2. The memory system of claim 1, wherein the operation mode of the memory block including the fail cell is stored in a cell array of the flash memory.

3. The memory system of claim 2, wherein the cell array of the flash memory is divided into a data field and a spare field, and the operation mode of the memory block including the fail cell is stored in the spare field.

4. The memory system of claim 2, wherein the cell array of the flash memory includes a plurality of memory blocks, and the operation mode of the memory block including the fail cell is stored in one of the plurality of memory blocks.

5. The memory system of claim 4, wherein the one of the plurality of memory blocks is a meta-block.

6. The memory system of claim 1, wherein the memory controller includes a mode storage that stores the operation mode of the memory block including the fail cell.

7. The memory system of claim 6, wherein the mode storage is an EEPROM (electronically erasable programmable read-only memory).

8. The memory system of claim 1, wherein the flash memory and the memory controller are integrated within one memory card.

9. The memory system of claim 1, wherein the flash memory is a NAND flash memory.

10. A memory card, comprising:
a flash memory configured to store multi-bit data in one memory cell; and
a memory controller configured to control programming of multi-bit data into the flash memory;
wherein when an $n^{th}$ bit is normally programmed, and a fail occurs in a programming an $n+1^{th}$ bit in the flash memory, a page of the flash memory including a fail cell is operated in an operation mode of the $n^{th}$ or lesser bit.

11. The memory card of claim 10, wherein the operation mode of the page including the fail cell is stored in a cell array of the flash memory.

12. The memory card of claim 11, wherein the cell array of the flash memory is divided into a data field and a spare field, and the operation mode of the page including the fail cell is stored in the spare field.

13. The memory card of claim 11, wherein the cell array of the flash memory includes a plurality of memory blocks, and the operation mode of the page including the fail cell is stored in one of the plurality of memory blocks.

14. The memory card of claim 13, wherein the one of the plurality of memory blocks is a meta-block.

15. The memory card of claim 10, wherein the memory controller includes a mode storage that stores the operation mode of the page including the fail cell.

16. The memory card of claim 15, wherein the mode storage is an EEPROM (electronically erasable programmable read-only memory).

17. A method of operating a memory system, comprising:
detecting a failure in programming an n+1th bit in a flash memory that is configured to store multi-bit data in one memory cell; and
operating a memory block of the flash memory including a fail cell in an operation mode of the nth or lesser bit.

18. The method of claim 17, further comprising:
storing the operation mode of the memory block including the fail cell in a cell array of the flash memory.

19. The method of claim 18, wherein the cell array of the flash memory is divided into a data field and a spare field, and storing the operation mode of the memory block including the fail cell comprises storing the operation mode of the memory block including the fail cell in the spare field.

20. The method of claim 18, wherein the cell array of the flash memory includes a plurality of memory blocks, and storing the operation mode of the memory block including the fail cell comprises storing the operation mode of the memory block including the fail cell in one of the plurality of memory blocks.

21. The method of claim 17, wherein the memory system comprises a memory controller that includes a mode storage;
the method further comprising storing the operation mode of the memory block including the fail cell in the mode storage.

* * * * *